United States Patent
Mochizuki

(10) Patent No.: US 7,811,873 B2
(45) Date of Patent: Oct. 12, 2010

(54) METHOD FOR FABRICATING MOS-FET

(75) Inventor: Marie Mochizuki, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 410 days.

(21) Appl. No.: 11/853,070

(22) Filed: Sep. 11, 2007

(65) Prior Publication Data

US 2008/0081402 A1     Apr. 3, 2008

(30) Foreign Application Priority Data

Sep. 29, 2006    (JP)   ............................. 2006-266316

(51) Int. Cl.
     *H01L 21/338*      (2006.01)
(52) U.S. Cl. ....................... 438/174; 257/348; 257/349; 257/E21.409
(58) Field of Classification Search ................. 257/349, 257/348, E21.409; 438/174
See application file for complete search history.

(56) References Cited

U.S. PATENT DOCUMENTS 6,825,074 B2    11/2004    Miura
6,861,322 B2 *    3/2005    Hirashita et al. ............ 438/308
2003/0122164 A1 *    7/2003    Komatsu ..................... 257/219
2009/0023269 A1 *    1/2009    Morimoto et al. ........... 438/458

FOREIGN PATENT DOCUMENTS

JP      2000-349295      12/2000
JP      2002270846      9/2002

* cited by examiner

*Primary Examiner*—David Vu
*Assistant Examiner*—Brandon Fox
(74) *Attorney, Agent, or Firm*—Volentine & Whitt, P.L.L.C.

(57) ABSTRACT

A method for fabricating MOS-FET using a SOI substrate includes a process of ion implantation of an impurity into a channel region in a SOI layer; and a process of channel-annealing in a non-oxidized atmosphere. In the ion implantation process, a concentration peak of the impurity is made to exist in the SOI layer. Moreover in the channel-annealing process, the impurity is distributed with a high concentration in the vicinity of the surface of the SOI layer under the following condition with the anneal temperature as T (K) and annealing time as t (minutes):

$$506\times1000/T{-}490 < t < 400\times1000/T{-}386.$$

8 Claims, 4 Drawing Sheets

METHOD FOR FABRICATING MOS-FET

CROSS REFERENCE TO RELATED APPLICATION

This application claims the priority of Application No. 2006-266316, filed Sep. 29, 2006 in Japan, the subject matter of which is incorporated herein by reference.

BACKGROUND OF THE INVENTION

1. Technical Field of the Invention

The present invention relates to a method for fabricating MOS-FET (field-effect transistor) using a SOI (Silicon On Insulator) type semiconductor substrate.

2. Description of the Background Art

A SOI substrate is a substrate in which a silicon single-crystal layer is formed on a silicon substrate with an insulating film layer formed on a surface layer portion. By forming a MOS transistor on the SOI substrate, characteristics improvement and reduction in a parasitic capacity are promoted, and a device capable of operation at a low voltage can be obtained.

There are two types of SOI layer in the SOI substrate: a fully depleted type and a partial depleted type. The fully depleted type SOI has the whole SOI layer depleted. On the other hand, the partial depleted type SOI partially has a portion not depleted. In order to make best of the characteristics of the SOI device that the parasitic capacity between a device and a substrate can be reduced and the like, the fully depleted type is more advantageous.

In the fully depleted type SOI, a lowered voltage and reduction in a load capacity can be realized at the same time, but the thickness of a silicon layer (SOI layer) forming a transistor with a threshold voltage applicable to a circuit is 50 nm or less.

In order to reduce an off-leak current and to increase the threshold value, it is necessary to increase an impurity concentration in a channel region. However, if the impurity concentration in the channel region is increased, the maximum depleted layer width is reduced and formation of the fully depleted type transistor becomes difficult.

According to the invention described in Japanese Patent Laid-Open No. 2000-349295, a position of a peak value of the impurity concentration in the channel region is set at a position shallower than a depth where the impurity concentration exceeds a carrier concentration in an inversion layer. The impurity concentration on the surface of the channel region becomes higher than that in a buried insulating film. By this arrangement, the fully depleted type transistor whose threshold voltage is increased while the off-leak current is reduced can be obtained.

A fabricating method disclosed in Japanese Patent Laid-Open No. 2000-349295 proposes a method for controlling a peak position of an implanted impurity and for epitaxial growth of a high-concentration layer using etching of a dummy layer or the SOI layer corresponding to the thickness of the dummy layer.

The method using the dummy layer is accompanied by fluctuation of the impurity peak position in a wafer face when the impurity is ion-implanted. Thus, in order to restrain the fluctuation in a dose amount of the impurity to be implanted, the peak of the implanted impurity needs to be at a sufficiently deep position in the SOI layer. Thus, application of the method to the fully depleted type SOI having a thin SOI layer with the thickness of 50 nm or less is difficult.

In the method using etching of the silicon layer corresponding to the dummy layer, there is a problem that the dose amount in the channel region is fluctuated by fluctuation of the etching. The method using the epitaxial growth has a problem that a throughput is poor with the growth under the condition that a single crystal SOI layer is sufficiently obtained.

SUMMARY OF THE INVENTION

The present invention is a method for fabricating MOS-FET for solving the above problems. Specifically, this is a method for fabricating MOS-FET semiconductor device in which the impurity concentration on the surface side of the channel region in the fully depleted type SOI layer is higher than that on the buried insulating film side.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

A first mode of the present invention includes, in a method for fabricating MOS-FET using a SOI substrate, a process of ion-implantation of an impurity into a channel region of the SOI layer; and a process of channel-annealing in a non-oxidized atmosphere. In the ion-implantation process, a concentration peak of the impurity is made to exist in the SOI layer. In the channel-annealing process, the impurity is distributed with a high concentration in the vicinity of the surface of the SOI layer under the following condition with an anneal temperature at T (K) and an annealing time at t (minutes):

$$506 \times 1000/T - 490 < t < 400 \times 1000/T - 386$$

A second mode of the present invention comprises, in a method for fabricating MOS-FET using a SOI substrate, a process for ion-implantation of an impurity into a channel region of the SOI layer; and a process of channel annealing in a non-oxidized atmosphere. In the ion-implantation process, a concentration peak of the impurity is made to exist in the SOI layer. The channel-annealing is carried out in a non-oxidized atmosphere at 600 to 750° C. for 5 to 90 minutes.

The present invention is particularly effective for a substrate for which the SOI technology is employed. That is because, in the SOI substrate, a material boundary on the back face in addition to the need of a large quantity of point defects in the vicinity of the surface becomes an element in controlling the diffusion. Also, in terms of the film thickness of the SOI layer and the impurity quantity in the channel region, it is suitable for the fully depleted type SOI layer. That is, with the impurity concentration peak value in the SOI layer at approximately 80 nm, for example, the impurity concentration distribution can not be controlled even if the anneal conditions are adjusted similarly to the case of a bulk substrate.

After a buried oxide film as an insulating film is formed on a silicon substrate, a silicon single crystal layer to be the SOI layer is formed. In the channel region of this SOI layer, an impurity for threshold voltage control is ion-implanted. The impurity is ion-implanted by adjusting implanting energy so that the peak of the impurity concentration being ion-implanted is in the SOI layer. After that, channel-annealing is carried out in a non-oxidized atmosphere, and the impurities are locally collected to the vicinity of a boundary with a gate insulating film in the SOI layer. In the above SOI layer, the impurities are distributed with a higher concentration in the vicinity of the boundary with the gate insulating film rather than the vicinity of the boundary with the buried insulating film.

Here, mere increase of the ion-implant amount into the SOI layer does not directly contribute to generation of interstitial atom since the amount of the impurities itself is increased. In the case of an N-type MOSFET, if the impurity introduced into the SOI layer is boron, it is preferable to select $BF_2$, not boron, as an ion-implant species, since more interstitial silicon can be generated using the presence of F. More preferably, in order to generate an arbitrary amount of the interstitial silicon, silicon is implanted into the SOI layer.

It is important to carry out the channel-annealing treatment according to the present invention in the non-oxidized atmosphere. In the oxidized atmosphere, point defects are newly introduced into the substrate during the oxidation processing, and the effect of impurity diffusion control by the present invention can not be obtained easily.

The channel-annealing causes excessive enhanced diffusion and locally collects the impurities to the vicinity of the boundary with the gate insulating film in the SOI layer. Then, a MOS-FET semiconductor device having the fully depleted type SOI layer in which the off-leak current is reduced and the threshold value is increase can be obtained.

The concentration peak in the impurity before channel-annealing after ion-implantation preferably exists in the vicinity of the center in the SOI layer. Then, fluctuation in the introduced impurity amount can be reduced.

In the present invention, the interstitial silicon contributing to excessive enhanced diffusion is increased, and the interstitial silicon may be introduced into the channel region by silicon implantation in addition to the ion implantation of the impurities.

The dose amount of said ion-implanted impurity is preferably $1.0 \times 10^{12}$ cm$^{-2}$ or more and $1.0 \times 10^{13}$ cm$^{-2}$ or less. With this extent, the silicon region is not made into amorphous but all the generated interstitial silicon contributes to heat diffusion. The dopant joined to the interstitial silicon due to excessive enhanced diffusion is diffused at a speed extremely higher than the impurity diffusion in thermal equilibrium. Here, in order to obtain the above dose amount, it is preferable to implant an impurity with an average concentration of 2.5E17 to 2.5E18/cm$^3$.

According to the present invention, the impurity is effectively moved locally to the vicinity of a boundary with the gate insulating film in the SOI layer by the excessive enhanced diffusion. As a result, the impurity concentration on the surface side in the channel region of the fully depleted type SOI layer becomes higher than that on the buried insulating film side. As going deeper into the SOI layer thickness direction, a steep profile of the impurity (dopant) can be created. A fully depleted type MOS field-effect transistor (MOS-FET) in which the off-leak current is reduced and the threshold value is increased can be formed with a high throughput.

DESCRIPTION OF REFERENCE NUMERALS

1: Silicon substrate
3: SOI layer
5: Impurity (dopant)
8: Gate electrode
9: Pocket
10: LDD region
12: Diffusion layer

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
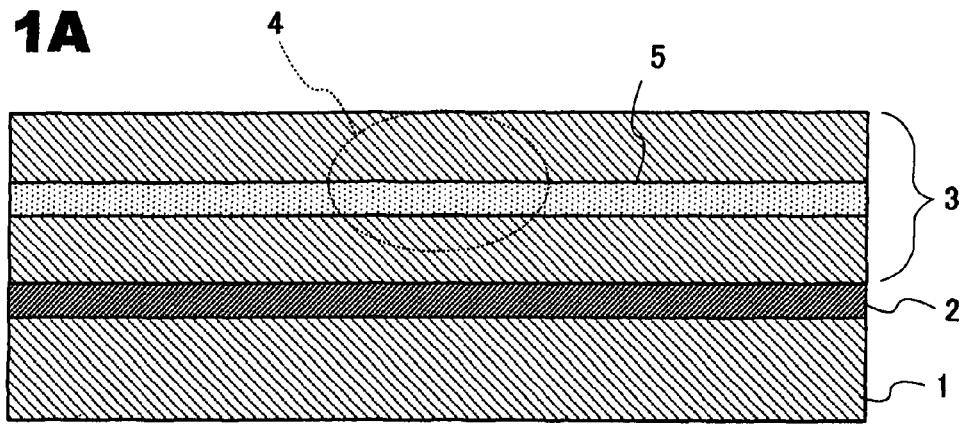
FIGS. 1A to 1H are partial sectional views illustrating a part of a method for fabricating a field-effect transistor according to an embodiment of the present invention.

The present invention will be described referring to an embodiment illustrated below. FIGS. 1A to 1H show an essential part of a method for fabricating a semiconductor device of the present invention. A buried oxide film 2 and a SOI layer 3 are formed on a silicon substrate 1, and a SOI substrate is formed as shown in FIG. 1A. The film thickness of the SOI layer 3 is preferably such that a fully depleted type transistor can be formed and impurity distribution can be formed by ion-implantation in the channel region, which is 20 to 50 nm. If the thickness of the SOI layer 3 is smaller than 20 nm, for example, the impurity amount to be introduced into the SOI layer is fluctuated by diffusion at ion-implantation, and formation of a practical transistor becomes difficult.

After that, an impurity 5 is ion-implanted in the channel region for threshold voltage control in the SOI substrate. As the impurity 5, P-type impurity such as boron, $BF_2$ or indium is used for an N-type MOSFET. On the other hand, in the case of an N-type MOSFET, a P-type impurity such as arsenic or phosphorus is used. As for the impurity 5 to be ion-implanted, implanting energy is selected so that its concentration peak exists in the SOI layer, which is ion implantation of approximately $1 \times 10^{12}$ to $1 \times 10^{13}$ cm$^{-2}$. Preferably, the concentration peak of the impurity 5 is distributed in the vicinity of the center in the SOI layer 3 as much as possible, when seen in the thickness direction of the SOI layer 3. By this arrangement, the fluctuation of the implanted impurity 5 can be reduced. Specifically, channel-annealing is carried out at an implantation acceleration 18 keV ($BF_2$) in a nitrogen atmosphere, for example.

Figure 1B:
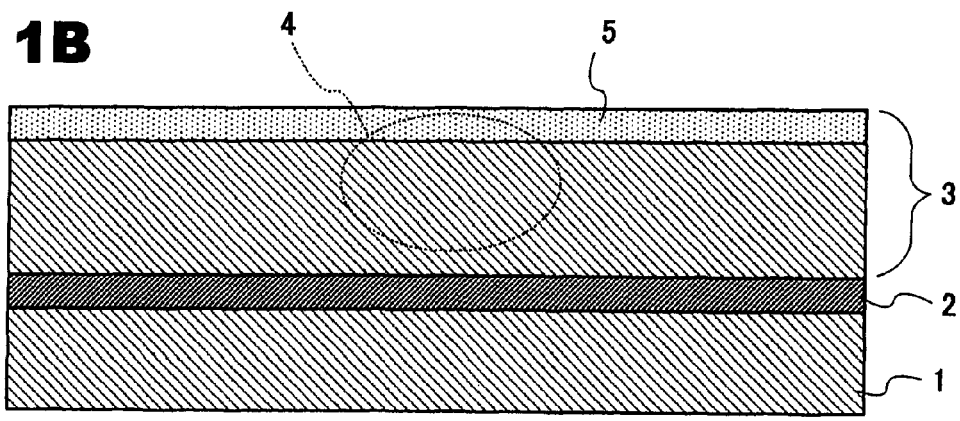

After that, the channel-annealing is continuously carried out for 5 to 90 minutes in a range 600 to 750° C. By the annealing treatment, as shown in FIG. 1B, excessive enhanced diffusion is caused in the implanted impurity 5, which is moved to the vicinity of a boundary (surface of the SOI layer) between a gate insulating film (6) and the SOI layer 3. In the SOI layer 3, the impurity 5 is distributed with a high concentration in the vicinity of the boundary with the gate insulating film (6) rather than the vicinity of the boundary with the buried insulating film 2.

Here, if the channel-annealing temperature exceeds 750° C., the impurity amount moving to the vicinity of the Si surface is decreased. If the annealing time falls below 5 minutes, extra interstitial silicon introduced into the Si substrate by ion implantation remains in the substrate and causes re-diffusion of the impurity having been moved to the vicinity of the surface in the substrate by the subsequent heat treatment. It is possible to set the anneal temperature at 600° C. or less, but it makes a required annealing time remarkably longer than 90 minutes, which lowers the throughput.

For the channel-annealing, a nitrogen atmosphere or the like is used so that the channel region is not exposed to an oxidized atmosphere. The relation between the channel-annealing temperature and time shall be as follows with the channel-annealing temperature at T (K) and channel-annealing time as t (minutes):

$$506 \times 1000/T - 490 < t < 400 \times 1000/T - 386$$

This formula is derived from results of a theoretical experiment of calibration based on actual measurement.

The working effect of the present invention can be obtained on the low temperature side even if time is somewhat longer. However, in the above range, a process with a shorter treatment time and higher throughput can be obtained. With this condition, a semiconductor device can be stably manufactured, even allowing for errors between equipment.

Figure 1C:
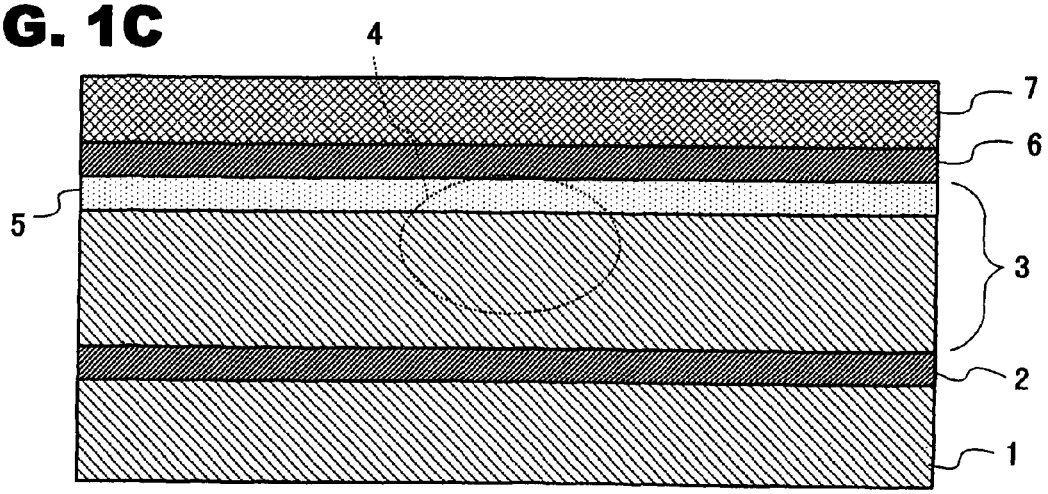

Next, as shown in FIG. 1C, a gate insulating film 6 is formed on the SOI layer 3. The formation of the gate insulating film 6 may be either before or after introduction of the impurity 5 into the channel region 4. Since the annealing treatment after formation of the gate insulating film is carried out through a thin gate insulating film, oxidation progresses in an oxidized atmosphere, and thus, annealing treatment in a non-oxidized atmosphere is important.

On top of the gate insulating film 6, a polysilicon layer 7 is formed for a gate electrode. As a gate impurity, phosphorus or arsenic, for example, may be implanted for the N-type MOSFET, while boron or BF2, for example, may be implanted for the P-type MOSFET. The ion-implantation dose amount of this gate impurity is set approximately at $2 \times 10^{15}$ cm$^{-2}$, for example.

Figure 1D:
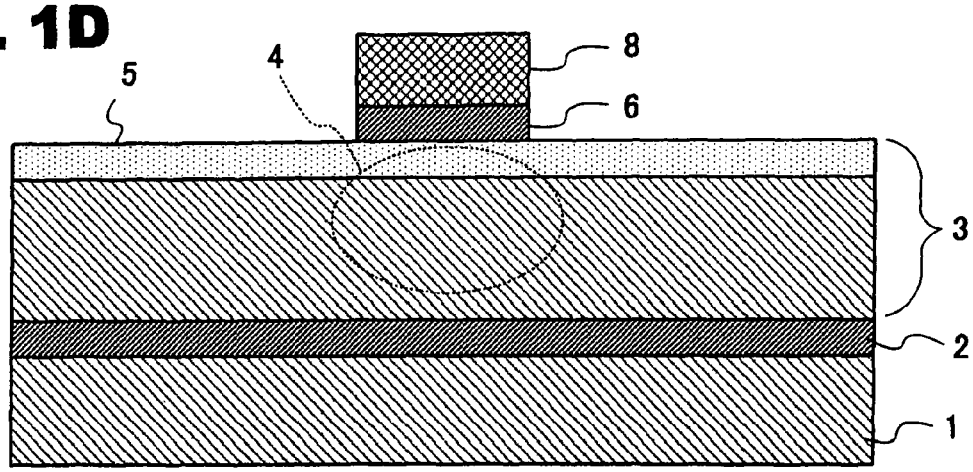

Next, as shown in FIG. 1D, the polysilicon layer 7 and the gate insulating film 6 are given patterning so as to form a gate electrode 8. An extremely thin oxide film may be formed in advance on the surface of the gate electrode 8 by oxidation treatment.

Figure 1E:
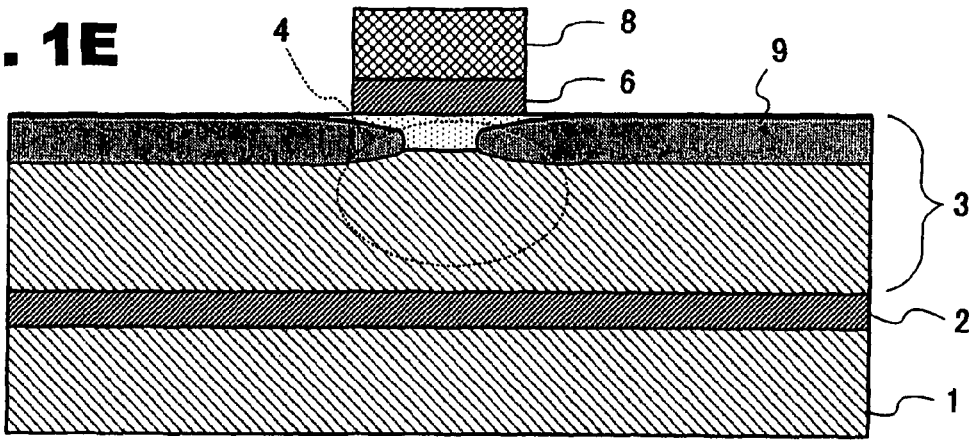

Next, as shown in FIG. 1E, a pocket 9 is formed by ion implantation of ion of the same conductive type as an ion species in the channel region into the surface layer portion of the SOI layer 3. This pocket 9 restricts threshold voltage drop at on/off of a transistor.

Figure 1F:
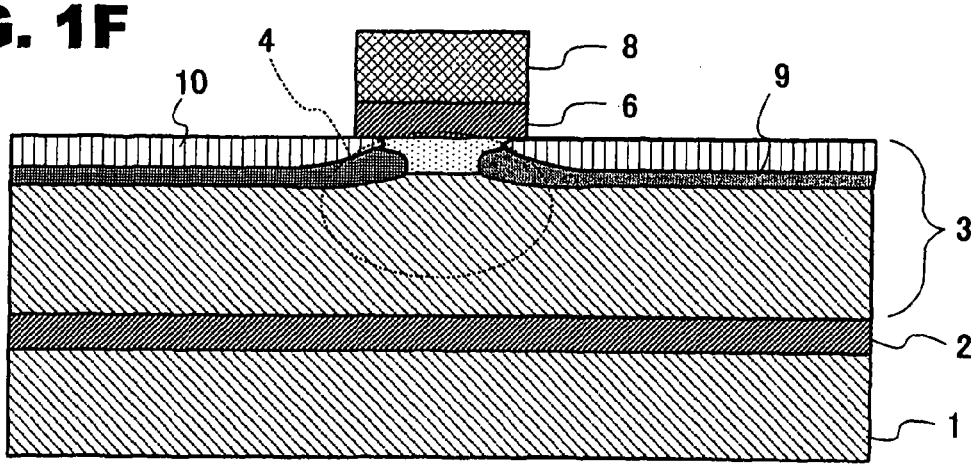

Here, in a transistor with a short gate length, a short-channel effect is increased, and if the impurity concentration of a drain and a source stays at the initial ion-implantation concentration, use as a transistor becomes difficult. On the other hand, if an interval between the source/drain and the channel region is taken sufficiently, an ion resistance is increased and there is a fear that the transistor will not function as required. Then, in the source/drain region, an LDD (Lightly Doped Drain) region 10 with the impurity concentration lower than the impurity concentration in the normal source/drain region by a single- or double-digit figure is provided (FIG. 1F). The LDD region 10 is formed by implanting phosphorus or arsenic for the N-type MOSFET or boron or BF$_2$ for the P-type MOSFET, for example.

Figure 1G:
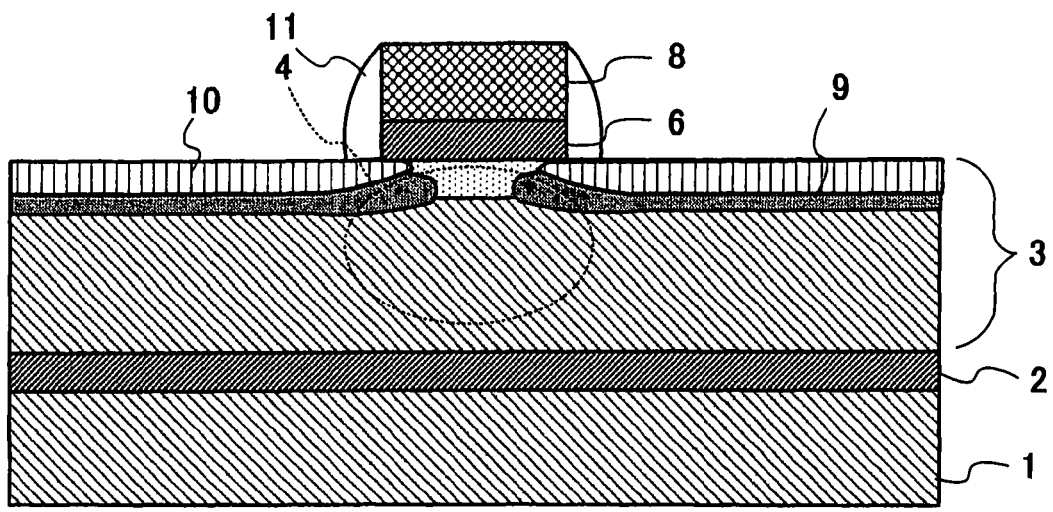

Next, as shown in FIG. 1G, a side wall 11 is formed on the side faces of the gate electrode 8 and the gate insulating film 6. The side wall 11 is formed by accumulating a silicon nitride film and etching it back, for example.

Figure 1H:
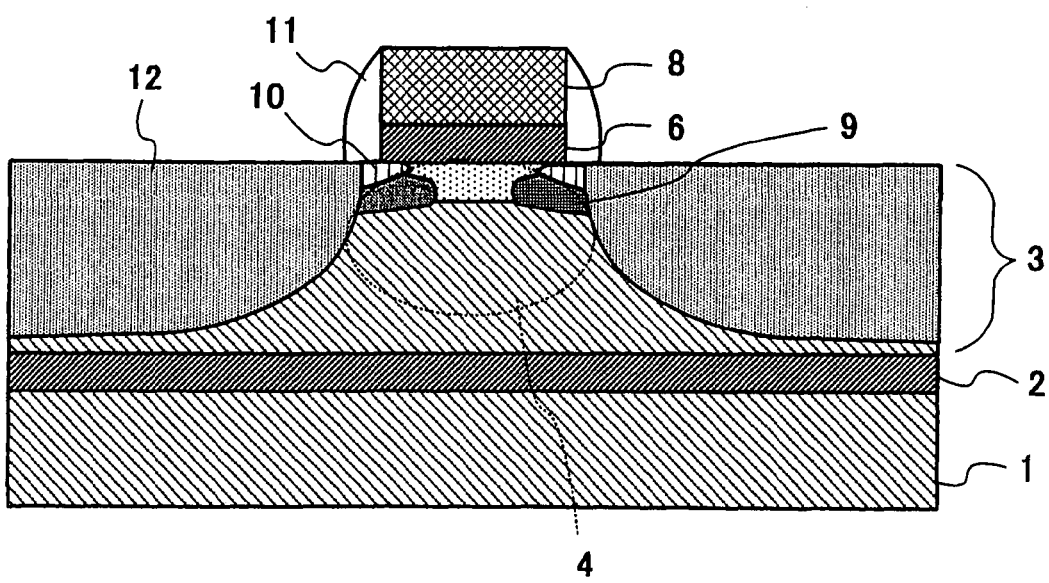

Next, as shown in FIG. 1H, a diffusion layer 12 is formed by ion implantation of the impurity. At the formation of the diffusion layer 12, phosphorus or arsenic is implanted for the N-type MOSFET, while boron or BF$_2$ may be ion-implanted for the P-type MOSFET.

A principle that the impurity in the SOI layer 3 locally accumulates in the vicinity of the boundary with the gate insulating film 6 will be described below in the MOSFET formed by the fabricating method of the present invention (FIG. 1H).

The impurity introduced into the channel region 4 has a dose amount of $1 \times 10^{12}$ to $1 \times 10^{13}$ cm$^{-2}$. By this setting, excess interstitial silicon is generated in an amount of approximately $5 \times 10^{12}$ to $3 \times 10^{13}$ cm$^{-2}$. In the case of ion implantation with this extent of dose amount, the silicon region is not made into amorphous but all the generated interstitial silicon contributes to diffusion. The impurity bonded to the excess interstitial silicon (dopant) is diffused at a speed extremely higher than that of impurity diffusion in a normal thermal equilibrium. This is called transient enhanced diffusion. The degree of dopant diffusion in the transient enhanced diffusion depends on the dopant amount to be bonded to the interstitial silicon. The interstitial silicon is bonded to a silicon atom on the interface between oxide silicon and silicon single crystal during the course of annealing and disappears. In the annealing at a low temperature, the interstitial silicon remains sufficiently longer than the bonding speed between the interstitial silicon and the dopant. Thus, the lower the anneal temperature is, the more remarkably the dopant accumulates on the interface between the oxide silicon and the silicon single crystal.

Normally, the transient enhanced diffusion is a phenomenon found in the diffusion layer 12 and the LDD layer 10, but not in the channel region 4. In the diffusion layer 12, the large amount of generated interstitial silicon causes the transient enhanced diffusion. In the LDD layer 10, since the shallow peak impurity concentration and close to the interface with the gate insulating film causes the similar diffusion. In channel formation by a bulk silicon device, the peak position of the impurity concentration is as deep as approximately 80 nm in the shallow case. Also, since the concentration of the introduced impurity is low, the amount of generated interstitial silicon is small. Therefore, the transient enhanced diffusion does not occur with the bulk silicon device.

The film thickness of the SOI layer 3 of the present invention is approximately 20 to 50 nm, and the concentration peak of the impurity at ion implantation is made to exist in the SOI layer 3. The concentration peak by this ion implantation is 50 nm at the deepest. By this arrangement, the interstitial silicon with the average concentration of approximately $1 \times 10^{18}$ to $6 \times 10^{18}$/cm$^3$ can be generated at a position sufficiently close to the interface between the gate insulating film and the SOI layer. By carrying out the channel-annealing at 600 to 750° C. after ion implantation for 5 to 90 minutes, excess interstitial silicon and the dopant are bonded to each other. By this bonding, transport of the dopant to the boundary between the gate insulating film and the SOI layer is made possible. As a result, the dopant is accumulated in the vicinity of the interface with the gate insulating film in the SOI layer, and a steep dopant profile can be obtained.

Figure 2:
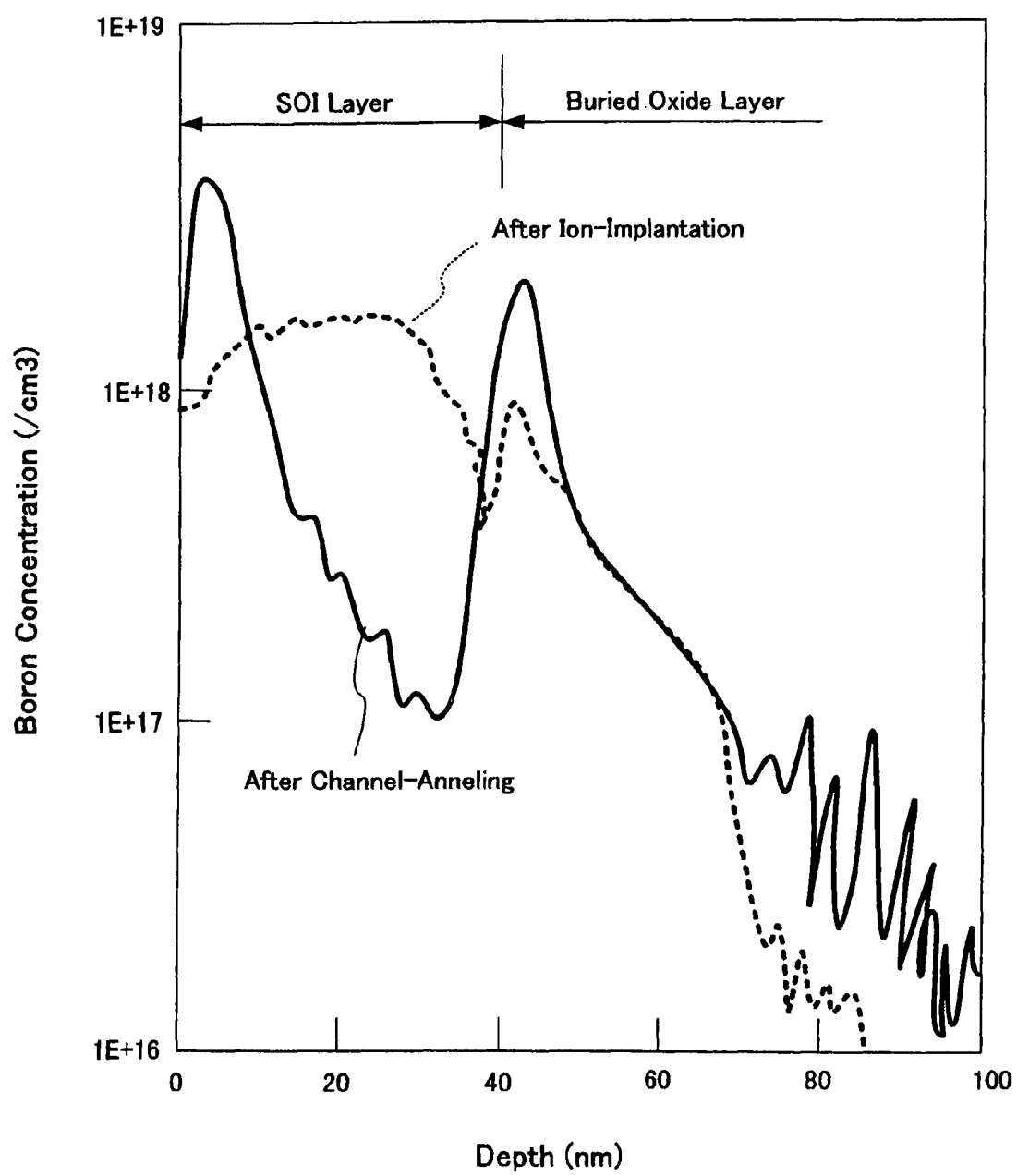
FIG. 2 is a graph for explaining an action of the present invention and a SIMS result illustrating boron concentration distribution in a channel region.

An SIMS result examining boron concentration distribution in the channel region before and after the channel-annealing by ion implantation of BF$_2$ of 5E$^{12}$ cm$^{-2}$ in the SOI layer with the film thickness of 40 nm is shown in FIG. 2. In FIG. 2, the unit of boron concentration (vertical axis) is $cm^3$. The profile immediately after ion implantation of $BF_2$ is indicated by a dot line. The profile after the channel-annealing at 620° C. for 70 minutes is indicated by a solid line. Immediately after ion implantation, the concentration peak of the impurity exists in the vicinity of the center in the SOI layer. After channel-annealing, the impurity concentration close to the surface becomes higher. The dopant profile (impurity distribution) in which the concentration is steeply lowered toward the deep portion in the SOI layer is obtained by the channel-annealing.

A mode example and an embodiment of the present invention has been described above based on some example so as to facilitate understanding of the present invention, but as obvious to those skilled in the art, the present invention is not limited to these embodiments at all but can be changed in the scope of the technical idea described in claims. For example, before and after implantation of the impurity into the channel region, interstitial silicon may be introduced by silicon implantation. By this arrangement, fluctuation in excess interstitial silicon distribution can be reduced.

What is claimed is:

1. A method for fabricating a MOS-FET using a SOI substrate, comprising:
    a process of ion-implantation of an impurity into a channel region in a SOI layer, the SOI layer having a thickness, wherein a concentration peak of the implanted impurity in the SOI layer is at a vicinity of a midpoint of the thickness; and
    a process of channel-annealing in a non-oxidized atmosphere, that moves the concentration peak of the implanted impurity to an upper surface of the SOI layer, said channel-annealing is carried out at 600 to 750° C. for 5 to 90 minutes.

2. The method for fabricating a MOS-FET according to claim 1, wherein a dose amount of said ion-implanted impurity is $1.0\times10^{12}$ $cm^{-2}$ or more and $1.0\times10^{13}$ $cm^{-2}$ or less.

3. The method for fabricating a MOS-FET according to claim 1, wherein the SOI layer has a fully depleted type structure.

4. The method for fabricating a MOS-FET according to claim 1, further comprising:
    a process of introducing interstitial silicon into the channel region in the SOI layer by silicon implantation prior to said channel-annealing.

5. A method of fabricating a semiconductor device comprising:
    ion-implanting an impurity into a channel region of an SOI layer, where the SOI layer has a thickness and has a first surface disposed on an insulating layer, a concentration peak of the implanted impurity in the SOI layer is at a vicinity of a midpoint of the thickness; and
    heat treating the channel region in a non-oxidized atmosphere to move the concentration peak of the implanted impurity from the midpoint to a second surface of the SOI layer that is opposite the first surface,
    said heat treatment is carried out at 600° C. to 750° C. for 5 to 90 minutes.

6. The method of claim 5, wherein a dose amount of the implanted impurity is $1.0\times10^{12}$ $cm^{-2}$ or more and $1.0\times10^{13}$ $cm^{-2}$ or less.

7. The method of claim 5, wherein the SOI layer is fully depleted.

8. The method of claim 5, further comprising implanting interstitial silicon into the channel region prior to said heat treatment.

* * * * *